Jan. 1, 1952 D. R. DE TAR 2,580,895

TUNING SYSTEM

Filed Feb. 24, 1949 3 Sheets-Sheet 1

Inventor:
Donald R. De Tar,

By Dawson, Ooms, Booth and Spangenberg,
Attorneys.

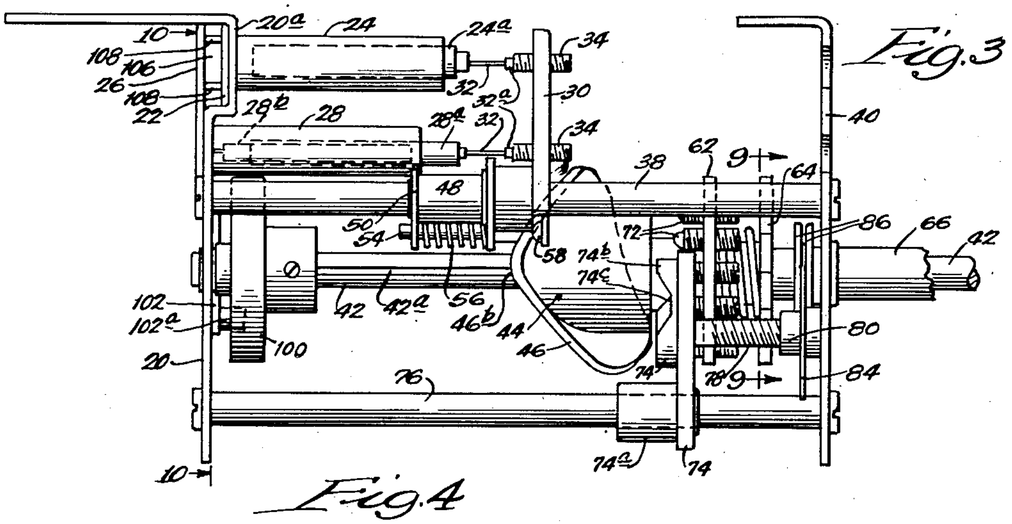
Fig. 3
Fig. 4
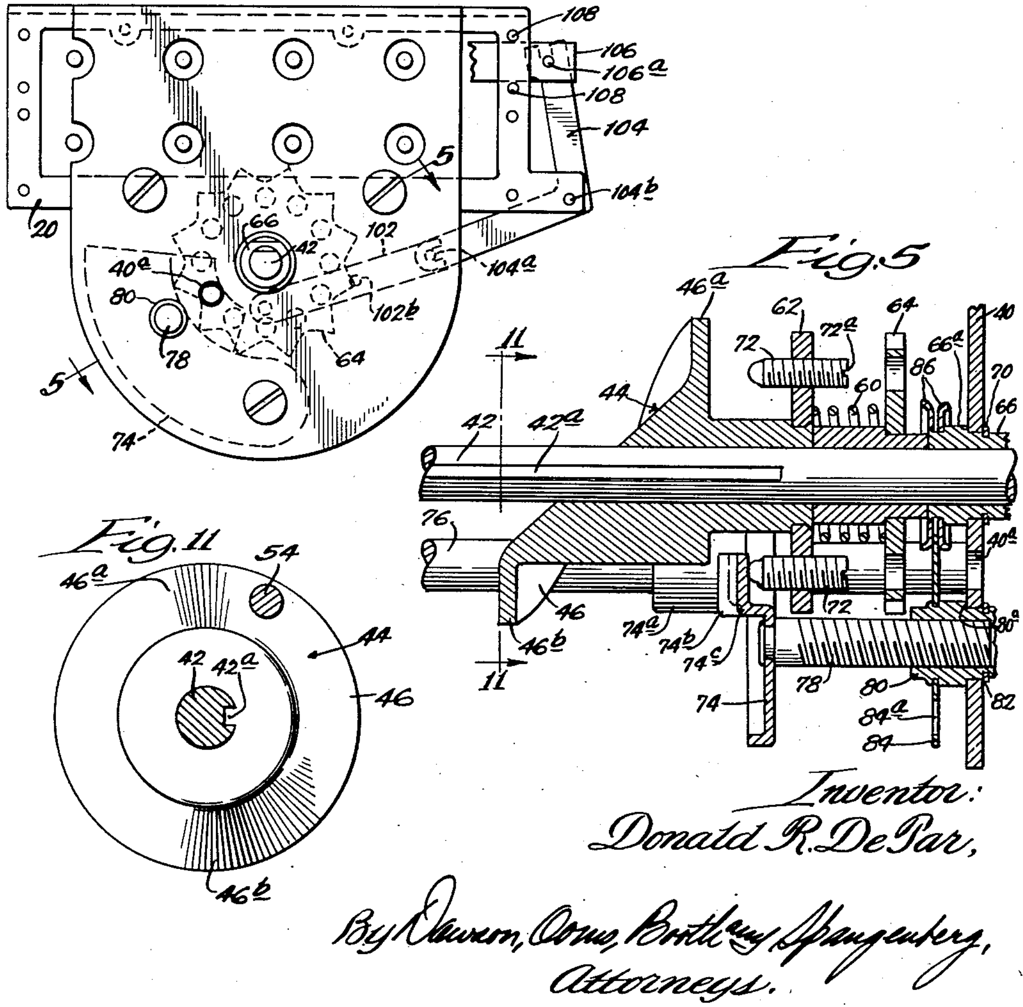
Fig. 5, Fig. 11
Inventor:
Donald R. De Tar,
By Dawson, Ooms, Booth & Spangenberg,
Attorneys.

Jan. 1, 1952

D. R. DE TAR 2,580,895

TUNING SYSTEM

Filed Feb. 24, 1949

3 Sheets-Sheet 3

Inventor:
Donald R. De Tar,
By Dawson, Ooms, Booth and Spangenberg,
Attorneys.

Patented Jan. 1, 1952

2,580,895

UNITED STATES PATENT OFFICE 2,580,895

TUNING SYSTEM

Donald R. De Tar, Stratford, Conn., assignor to Aladdin Industries, Incorporated, Chicago, Ill., a corporation of Illinois Application February 24, 1949, Serial No. 78,213

13 Claims. (Cl. 250—40)

My invention relates to an improved tuning system particularly suitable for use in television receivers.

In television receivers it is necessary to provide tuning means selectively adjustable to any one of many television station channels. These channels currently cover two separate and distinct frequency ranges; one range (channels 2 to 6) covering from about 54 megacycles to about 88 megacycles and the other range (channels 7 to 13) covering from about 174 megacycles to 216 megacycles.

Considerations of convenience of tuning render it desirable to provide a tuner in which the channels are selected by number rather than frequency and that the channels be selected in numerical order as the knob is rotated. Moreover, it is desirable to provide a tuner wherein the adjustment may be made from any channel to any other channel in the most convenient direction, whether backward or forward.

In a tuning system for television or like purposes it is desirable to provide a device in which the movements of the tuning member are utilized to the fullest extent. The expense, size, and reliability of the mechanical tuning means or channel selector is to a large measure determined by the extent of tuning movement required and the accuracy demanded of the tuning movements.

In accordance with the present invention the available mechanical movement of the channel selector is utilized to a maximum degree. Moreover, the system is adapted for use in covering widely spaced tuning bands or closely spaced bands covering a frequency range too great for efficient coverage by a single tuner.

Apparatus shown herein but not claimed is shown and claimed in the copending application of Donald R. De Tar and Martin Kirk, entitled Channel Selector, U. S. Patent No. 2,521,968, granted September 12, 1950, assigned to the same assignee as the present invention.

It is therefore a general object of the present invention to provide an improved tuning system suitable for television purposes.

Another object of the present invention is to provide a tuning system capable of efficiently covering frequency channels in two bands spaced apart by a substantial frequency or closely spaced bands covering a frequency range too great for efficient coverage by a single tuner.

Still another object of the present invention is to provide an improved tuning system capable of using one type of tuner over one portion of the frequency range and another type of tuner over another portion of the frequency range.

Another object of the present invention is to provide a tuning system capable of utilizing to the fullest extent the available movement of the channel selector with which it is associated.

The novel features which I believe to be characteristic of my invention are set forth with particularity in the appended claims. My invention itself, together with further objects and advantages thereof, will best be understood by reference to the following description taken in connection with the accompanying drawings in which:

Figure 3 is a side elevational view of the tuner of Figure 1 and showing the tuning inductors in place;

Figure 4 is a front elevational view of the tuner with the tuning knobs removed;

Figure 5 is a cross-sectional view through axis 5—5, Figure 4;

Figure 11 is a fragmentary cross-sectional view along axis 11—11, Figure 5.

In this application the term "channel selector" is used to refer to the mechanism by which one or more tuning members are moved to tune to one or more station channels or frequencies. The term "tuner" is used broadly to refer to any device capable of adjusting the tuning or resonant frequency of an associated circuit in accordance with the movement of a tuning member. In the specific device described herein the tuner is an inductor having its inductance varied by movement of a tuning member comprising a magnetic core or a conducting sleeve.

Figure 1:
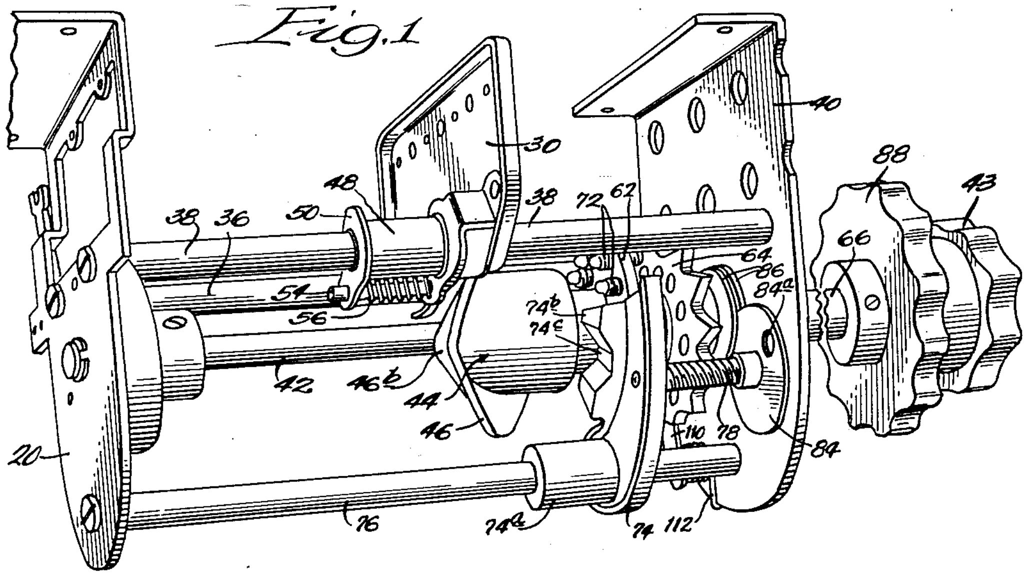
Figure 1 is a view in perspective of a tuner constructed in accordance with the principles of the present invention but with the individual inductors removed.
Figure 2:
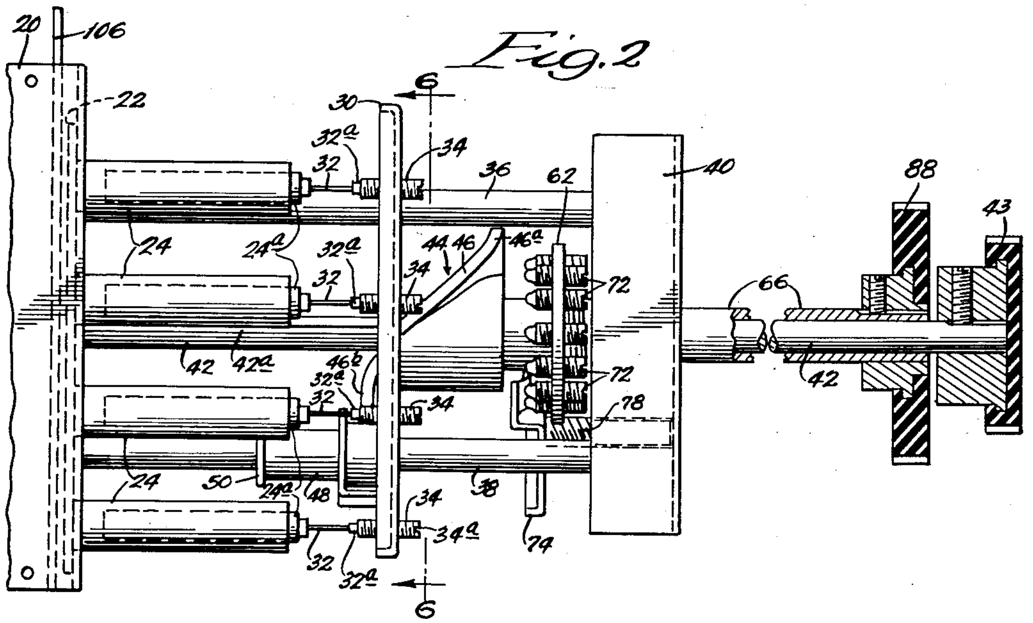
Figure 2 is a top plan view of the tuner of Figure 1 and showing the tuning inductors in place.

Referring now to Figures 1 to 3, the channel selector comprises a back plate 20 capable of receiving an upper mounting member 22 which in turn supports a group of core type tuning inductors 24 (Figures 2 and 3). The back plate 20 also receives a lower mounting member 26 to which is affixed a plurality of corresponding sleeve type tuning inductors 28 (Figure 3).

Each core type tuning inductor 24 has a cooperating shiftable magnetic plunger 24*a* capable of varying the inductance thereof and hence the frequency of tuning. When these cores are in the inserted position, where they are almost wholly within the hollow inductor portions 24 of the inductor, the inductance is at the maximum value and the resonant frequency corresponds to the lowest channel of the low frequency television band, namely, about 57 megacycles. When these cores are withdrawn from the inductor portions, the inductance is decreased and the resonant frequency rises to a value corresponding to the highest channel of the low frequency television band, namely, about 85 megacycles.

Each of the sleeve type tuning inductors 28 has a cooperating tuning sleeve 28*a* adapted to fit into the annular space between each inductor and the corresponding magnetic core 28*b*. This sleeve is made of aluminum or like conducting material and is capable of being inserted into or withdrawn from the corresponding inductor by movement in the same direction as the movement of cores 24*a*. As these sleeves are inserted into the inductors, they act as short circuited, low impedance turns having increased degrees of coupling with the inductor and, increased shielding effect on cores 28*b*, thereby increasing the resonant frequency of the circuit of which each inductor forms a part. The inductors 28 and sleeves 28*a* are designed to tune the circuits with which they are associated to the lowest channel of the high frequency television band (about 177 megacycles) when withdrawn and to the highest channel of the high frequency television band (about 213 megacycles) when completely inserted.

The cores 24*a* and the sleeves 28*a* are supported for movements in unison by the shiftable carriage 30. This support is derived from a plurality of flexible wire supports 32, one connected to each of the sleeves and cores, and each carrying at its opposite end the externally threaded screw 34. The carriage 30 receives the screw 34 corresponding to each support 32. Each of these screws is attached to the corresponding support 32 to form a unitary structure of screw, support, and core or sleeve.

Each screw 34 has a screw driver receiving slot 34*a*, Figure 2, for purposes of adjustment. The carriage 30 has an array of openings 30*a*, Figure 6, in alignment with the inductors 24 and 28 and each adapted to threadedly receive a screw 34.

Figure 6:
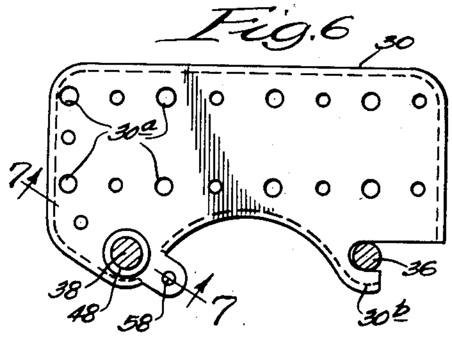
Figure 6 is a cross-sectional view through axis 6—6, Figure 2.

The carriage 30 is held for shifting movements on the track defined by rails 36 and 38. These rails are each affixed at one end to the back plate 20 and at the opposite end to the front plate 40. The carriage 30 has an opening which receives bushing 48 which in turn receives the rail 38 as shown in Figure 6. The carriage 30 also defines a hook shaped portion 30*b* which nearly encircles rail 36 as also shown in that figure. Thus carriage 30 is restrained for shifting movements in the direction of orientation of the rails 36 and 38 and hence the direction of orientation of the inductors 24 and 28.

A centrally disposed shaft 42 extends from back plate 20 to front plate 40 below and intermediate rails 36 and 38. This shaft is aligned with these rails and receives a cam assembly indicated generally at 44.

The cam assembly 44 is slidably received on shaft 42 but is held for rotations therewith. This is accomplished by the keyway 42*a* extending along the length of shaft 42 and which receives the mating key portion of cam 44 as seen best in Figure 11.

The cam assembly 44 defines a cam 46 formed by a radially extending wing. This wing curves as it encircles the shaft 42 to define a continuous surface having diametrically opposed portions 46*a* and 46*b*, Figure 2, at the extreme axial positions and connected by intermediate points of smoothly varying axial positions. Preferably this cam assembly is of cast metal such as aluminum or a molded phenolic material.

Figure 7:
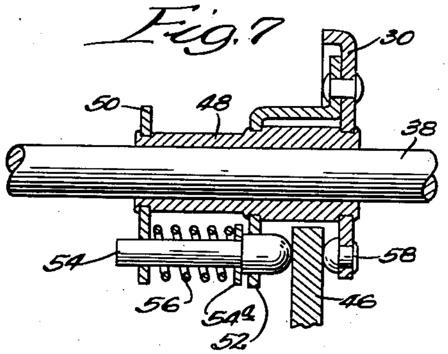
Figure 7 is a cross-sectional view through axis 7—7, Figure 6.

The carriage 30 is held for shifting movements in response to rotation of cam 44 by the spring biased take-up seen best in the view of Figure 7. This device is affixed to the bushing 48 which is mounted on carriage 30 and defines a passage to receive the rail 38. Rearwardly of the carriage 30, the bushing 48 receives a pair of spaced disks 50 and 52 which have aligned openings to receive the detent 54. The latter member has an annular wall 54*a* against which coil spring 56 bottoms to urge the detent against the surface 46 of the cam.

The carriage 30 extends to an aligned position relative to detent 54 and a rivet-like button 58 is mounted therein.

Under the bias of spring 56, detent 54 is urged against the cam surface 46*b* to hold button 58 snugly against cam surface 46*a*. Carriage 30 is thereby constrained to shift in response to the axial positioning of the particular portion of cam surface 46 sandwiched between button 58 and detent 54.

As seen best in the cross-sectional view of Figure 5, the cam 44 is urged backwardly towards the back plate 20 by the spring 60. This spring bottoms against the turret plate 62 which is held tightly on cam 44 to form a part thereof and at its opposite end bottoms against the star wheel 64. The latter wheel is fixedly mounted on sleeve 66 which is held against shifting movements relative to plate 40 by the annular wall 66*a* and the snap ring 70, the latter being received in a cooperating circumferential groove in sleeve 66.

The turret plate 62 receives a plurality of circumferentially spaced adjusting screws 72, one corresponding to each of the station channels desired to be tuned. Each of these screws is threadedly received on turret plate 62 and has a slot 72*a* adapted to receive a screw driver for adjusting purposes.

The screws 72 selectively bottom against the stop member 74 in accord with the rotations of shaft 42 and turret 62. As seen best in Figure 3, this stop member is attached to a sleeve 74*a* which in turn is received on the rail 76. The latter is affixed at its opposite ends to the front plate 40 and rear plate 20 and limits stop 74 to shifting movements in a direction parallel to shaft 42.

The stop 74 has a V-shaped portion 74*b* with a central part 74*c*, Figure 5, which engages the screw 72 in registry therewith, thus fixing the axial position of the cam 44 as it is urged backwardly by spring 60.

The position of the stop 74 in the direction of the axis of rail 76 is determined by the threaded stud 78, Figure 5, which is held in fixed position relative to stop 74. The stud 78 is threadedly received by sleeve 80. This sleeve is held in fixed axial position relative to front plate 40 by the annular wall 80a and the cooperating snap ring 82, the latter being received in a suitable circumferential slot formed in sleeve 80.

The bushing 30 also receives the disk 84 which is fixedly attached thereto and rotates with the rotations of the bushing. This disk is in frictional engagement with the opposed resilient disks 86 mounted on sleeve 66 and which snugly receive disk 84 near its outer periphery.

The bushing 66 extends outside the front plate 40, Figure 1, and there receives the vernier tuning knob 88 as shown. When this knob is rotated, disks 86 and 84 are likewise rotated. This varies the threaded engagement between bushing 80 and stud 78 to shift stop 74 relative to front plate 40. As a consequence, the entire cam 44 is bodily shifted and the position of carriage 30 altered accordingly.

As will be described in further detail hereafter, the cam surface 46 is shaped to shift carriage 30 to positions roughly corresponding to the positions requisite for the desired tuning. At each station point or channel, the carriage is accurately adjusted to the desired position by adjusting the position of the corresponding screw 72, thus compensating for deviations in the shape of cam surface 46 from the surface necessary to achieve perfect tuning. Vernier adjustments at any one channel are achieved by rotation of bushing 66 to overcome any inaccuracies in the settings of screws 72 and the effects of variations of temperature, humidity, etc. on the tuning.

The cam 44 is provided with a cam surface 46 defining a continuous surface with diametrically opposed points 46a and 46b, Figure 5, at opposite extremes of axial position. Consequently, as the shaft 42 is rotated over a full revolution (360°), the carriage 30 is first shifted from one extreme axial position to the other extreme axial position and then shifted back to the initial position. In accordance with the present invention switch elements are correlated with these shifting movements to connect the core tuned inductors 24 in circuit during the first movement and the sleeve tuned inductors 28 in circuit during the second movement.

Figures 8, 9, 10:
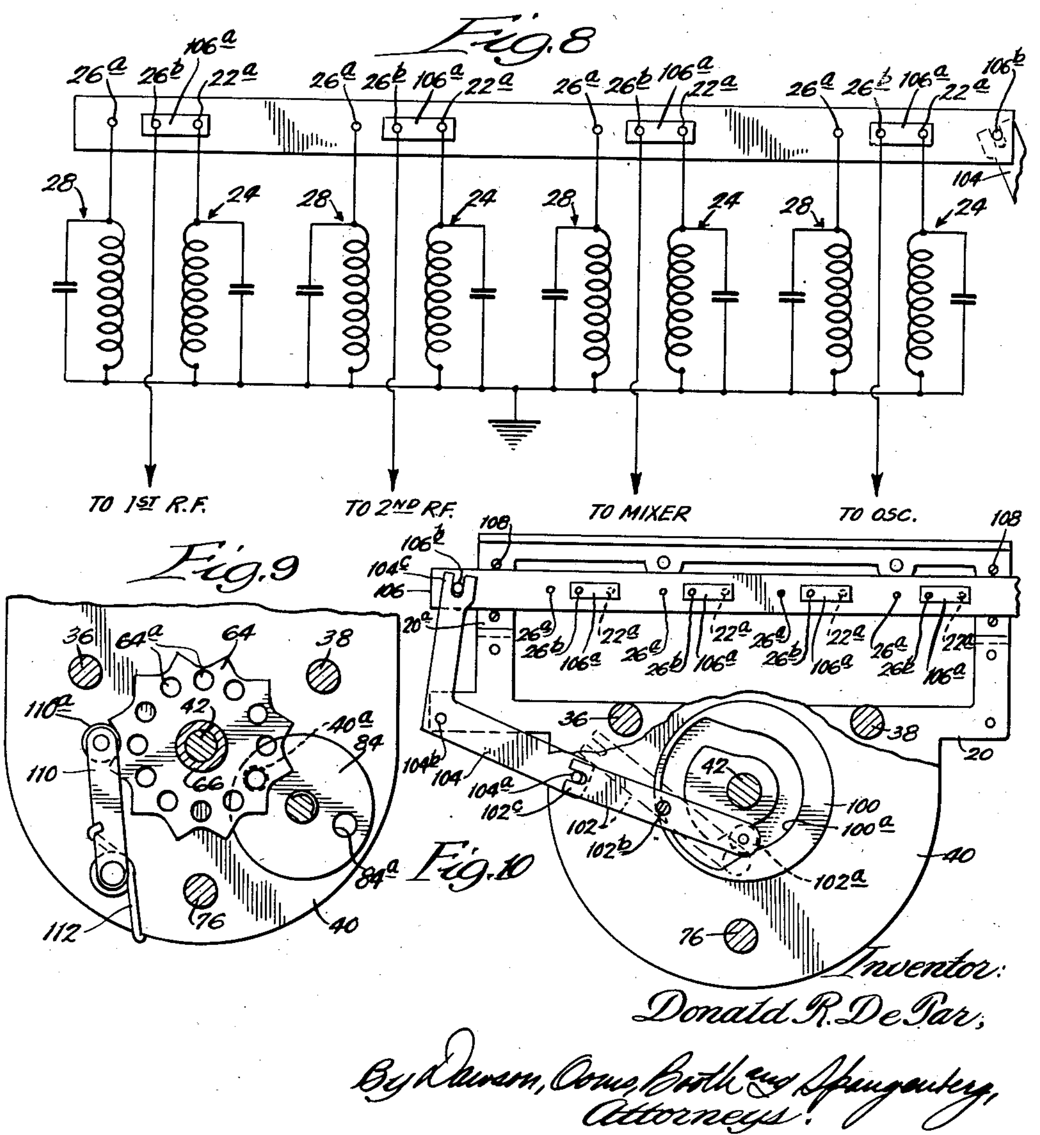
Figure 8 is a diagrammatic view showing the switch mechanism of the structure of Figure 1.
Figure 9 is a cross-sectional view through axis 9—9, Figure 3.
Figure 10 is a fragmentary cross-sectional view through axis 10—10, Figure 3, and with parts deleted to show more clearly the structure of the switch mechanism.

The switch structure may best be understood by reference to Figure 10 which is a cross-sectional view through Figure 3 and showing the switch operating elements. As shown, a disk 100 is mounted on shaft 42 adjacent back plate 20. This disk has a continuous groove 100a cut in its back face to define a cam groove to receive the roller 102a of rockable arm 102. The latter is held for rocking movements relative to back plate 20 by pin 102b shown in cross-section in Figure 10.

The arm 102 has a forked end portion 102c which receives the pin 104a mounted on crank arm 104. The latter is rockably supported from back plate 20 by the pin 104b and has a forked end portion 104c. The latter portion of crank 104 receives pin 106b of the shiftable switch rail 106.

The switch rail 106 is held for shifting movements relative to back plate 20 by forwardly bent portion 20a, Figure 3, of that plate which cooperates with lower mounting member 26 to define a slot to receive that rail. The rail 106 is guided within the slot so defined by the pins 108 which extend from portion 20a of plate 20 to points adjacent member 26.

The rail 106 is of insulating material, such as a phenol formaldehyde condensation product, and is formed with a plurality of spaced conducting inserts 106a, one corresponding to each pair of inductors. The upper mounting member 22 is of similar insulating material having a plurality of spaced contact buttons 22a, Figure 10, one corresponding to each core tuned inductor 24 and connected thereto as shown in Figure 8.

The lower mounting member 26 has a plurality of forwardly facing contact buttons 26a, Figure 10, adapted to engage the rail 106 when it is shifted to the left hand extreme of movement as seen in Figure 10. These are shown in cross-section in Figure 10 since they protrude from member 26 into the plane of the cross section of that figure. As shown in Figure 8, each of these contacts is connected to one of the sleeve tuned inductors 28.

The member 26 further has a plurality of spaced contact buttons 26b. These are like buttons 26a but are positioned intermediate buttons 22a and 26a for continuous contact with the conducting members 106a. As is shown diagrammatically in Figure 8, these contact buttons are connected to the several circuits desired to be tuned such as, for example, the first and second radio frequency amplifiers, the mixer, and the local oscillator of a superheterodyne television receiver.

It will be observed that the groove 100a is at a small radial distance from shaft 42 over substantially half of its circumferential length and at a larger radial distance for substantially the remainder of its length. Consequently, as the shaft 42 is rotated arm 102 has the position of Figure 10 for half the revolution and is rocked in the clockwise direction for the remainder of the revolution. When the arm 102 is in the position of Figure 10 the shiftable rail 106 is in the right hand extreme of movement as seen in Figure 10 and thereby connects the core tuned inductors 24 in the circuit by reason of the contact established between contact buttons 26b and 22a by the conducting members 106a. When the arm 102 is in the other extreme of movement as shown in the dotted lines of Figure 10, the shiftable rail 102 is shifted to the left hand extreme of movement as seen in Figures 8 and 10 and connects the sleeve tuned inductors 28 in the circuits by reason of the contact established between contact buttons 26b and 26a by the conducting members 106a.

The rocking movements of arm 102 are correlated with the shifting movements of carriage 30 to cause the inductors 24 to be connected to the circuits when cam 44 shifts carriage 30 in one direction with clockwise rotation of shaft 42 and to connect inductors 28 in the circuits when cam 44 shifts carriage 30 in the opposite direction with clockwise rotation of shaft 42.

Thus as the shaft 42 is rotated over a complete revolution (360°) starting with one of the diametrically opposed extreme points (46a or 46b) in registry with follower 54, the following events take place.

A. Low band channel selection (channels 2 to 6):

1. Over the first half revolution (0° to 180°) the core tuned inductors 24 are connected in circuit.
2. The carriage 30 progressively withdraws the cores 24$a$ and sleeves 28$a$ from the inductors.

3. The inductors 24 are tuned in steps from one channel to another in order of increasing frequency.

B. Switch actuation:

4. Shifting of rail 106 disconnects inductors 24 and connects inductors 28.

C. High band channel selection (channels 7 to 13):

5. Over the second half revolution (180° to 360°) the sleeve tuned inductors 28 are connected in circuit.
6. The carriage 30 progressively inserts cores 24$a$ and sleeves 28$a$ into the inductors.
7. The inductors 28 are tuned in steps from one channel to another in order of increasing frequency.

D. Switch actuation:

8. Shifting of rail 106 disconnects inductors 28 and connects inductors 24.

It will be observed that the total shifting movement of carriage 30 effective for tuning is twice the actual distance between the extremes of carriage movement. This is accomplished by causing the withdrawing movement to cover one tuning band and the inserting movement to cover another tuning band.

Moreover, the segregation of the two tuning functions, one corresponding to each band, permits use of one type tuner in one band and another type tuner in the other band. This has the advantage of permitting optimum design of each tuner as dictated by the tuning range desired to be covered.

The star wheel 64, Figure 9, and the detent arm 110 coact to impart snap action to the rotational movements of the shaft 42 and to register one of the screws 72 with the stop 74 at all times. The arm 110 has a roller 110$a$ which rides on the periphery of wheel 64 and is biased against that wheel by the spring 112.

Star wheel 64 has a plurality of spaced openings 64$a$, one corresponding to each of the screws 72. These are in registry with these screws to permit access to the same from front panel 40.

Front panel 40 has an opening 40$a$, Figure 9, in registry with the stop 74 and hence the particular screw 72 bearing against that stop. However, access to this screw from front panel 40 is normally obstructed by disk 84.

The disk 84 has an opening 84$a$ adapted to register with the opening 40$a$ to permit access to the screw 72 resting on stop 74. This opening is positioned to register with opening 40$a$ only when disk 84 is in the position half way between the extremes of movement thereof.

When the opening 84$a$ is registered with the opening 40$a$, the vernier adjustment of the tuner is in the intermediate position and capable of equal adjustment in either direction. By adjusting the specific screw 72 in registry with the stop 74 to center the channel being tuned to the desired frequency while the vernier is in this intermediate position, a maximum degree of flexibility for future adjustment by vernier action is assured.

While I have shown and described my invention as applied to a structure wherein half of the channels are in one frequency band and the other half are in another frequency band, it will be observed that by properly forming cam 46 and the groove 100$a$ in disk 100, the unit may be operated over frequency bands having unequal numbers of channels. Moreover, by appropriate design of cam 46 the station channels may be equally spaced insofar as rotation of shaft 42 is concerned even though their frequency spacings are unequal and the required movements of carriage 30 are not equal.

In Figure 8, the tuners 24 and 28 are each shown as an inductor with a shunting capacitor. The latter represents the inherent distributed capacitance of the inductor and any separate lumped capacitance provided.

From the above description it will be evident that the core tuners 24 have tuning members movable along a path (in this case a straight line) for tuning and the sleeve tuners 28 have tuning members movable along the same path for tuning (in this case straight lines coincident with the lines of movement of the sleeve tuners). The effect of movements of carriage 30 is to move the tuning members 24$a$ and 28$a$ over their respective paths of movement.

While I have shown and described a specific embodiment of my invention it will of course be understood that I do not wish to be limited thereto and that by the appended claims I intend to cover all modifications and alternative constructions as fall within the true spirit and scope of my invention.

What I claim as new and desire to secure by Letters Patent of the United States is:

1. A tuning system for use with an electric circuit, said system comprising in combination, a first tuner having a member movable in one direction to increased tuning frequency, a second tuner tunable over a different frequency band having a member movable in opposite direction to increased tuning frequency, means to move said members in unison over a complete cycle having a first portion of movement in one direction and a second portion of return movement in the opposite direction, and switch means adapted to connect said circuit to one of said tuners during the first portion of said movement and to the other of said tuners during the second portion of said movement.

2. A tuning system for use with an electric circuit comprising in combination, a first tuner having a member movable in one direction to increased tuning frequency, a second tuner tunable over a different frequency band having a member movable in the opposite direction to increased tuning frequency, means operable when rotated to move said members in unison from one extreme of movement to the other extreme of movement when rotated in one direction over a first range of rotation and by continuing said rotation in the same direction to a second range to move said members from said other extreme of movement back to said one extreme of movement, and switch means operable to connect one of said tuners to said circuit when said means is in said first range and to connect the other of said tuners to said circuit when said first means is in said second range.

3. A tuning system for use with an electric circuit comprising in combination, a first tuner having a member movable in one direction to increased tuning frequency, a second tuner tunable over a different frequency band having a member movable in the opposite direction to increased tuning frequency, means supporting said members for movements in unison, cam means operable to move said means and said members, said cam means being operable to move said first means and said members from one extreme of movement to the other extreme of movement when rotated in one direction over a first range of rotation and by continuing said rotation in the same direction to move said first means and said members from said other extreme of movement back to said one extreme of movement, and switch means operable to connect one of said tuners to said circuit when said cam means is in said first range and to connect the other of said tuners to said circuit when said cam means is in said second range.

4. A tuning system for use with an electric circuit and adapted to cover a range of frequencies in preselected order with tuning movement, said mechanism comprising in combination, a first tuner having a member movable along a path to cover a frequency band, a second tuner tunable over a different frequency band having a member movable along a path to cover a frequency band, means supporting said members for movements in unison over their respective paths in a complete cycle comprising a first portion from one extreme of movement to the opposite extreme of movement and a second portion back to the original position, and switch means adapted to connect said circuit to one of said tuners for the first portion of said movement and to the other of said tuners for the second portion of said movement.

5. A tuning system for use with an electric circuit and adapted to cover a range of frequencies in preselected order with tuning movement, said mechanism comprising in combination, a first tuner having a member movable along a path to cover a frequency band, a second tuner having a member movable along a path to cover a different frequency band, means operable to move said members in unison from one extreme of each of their respective paths to the other extreme of movement when moved in one direction over a first range of movement and upon continuation of said movement in the same direction to a second range to move said members from said other extreme of movement back to said one extreme of movement, and switch means operable to connect one of said tuners to said circuit when said means is in said first range of movement and to connect the other of said tuners to said circuit when said means is in said second range of movement.

6. A tuning system for use with an electric circuit and comprising in combination, a first tuner comprising an inductor and a movable core, a second tuner comprising an inductor and a movable sleeve, means sustaining said inductors in parallel orientation, a carriage on one side of said inductors supporting said core and said sleeve for movements in unison, a mechanism operable when moved in a predetermined direction first to move said carriage from one extreme of movement to the other extreme of movement and secondly to move said carriage back to the initial position, and switch means operable in response to the position of said last mechanism to connect one of said tuners to said circuit during said first movement and the other of said tuners to said circuit during said second movement.

7. A tuning system for use with an electric circuit and comprising in combination, a first tuner having an inductor and a movable tuning core, a second tuner having an inductor and a movable tuning sleeve, means supporting said inductors in parallel orientation, a carriage on one side of said inductors supporting said core and said sleeve for movements in unison, cam means having a member operable when rotated over substantially 360° first to move said carriage from one extreme of movement to the opposite extreme and secondly to move said carriage back to the initial position, and switch means operable in response to the movement of said last member and adapted to connect one of said inductors to said circuit during said first movement and the other of said inductors to said circuit during said second movement.

8. A tuning system for use with a plurality of circuits comprising an array of pairs of inductors oriented along parallel axes, one pair corresponding to each of said circuits and one inductor of each pair having a tuning sleeve and the other inductor of each pair having a tuning core, a carriage, individually adjustable means sustaining each of said sleeves and said cores on said carriage, means operable when rotated over substantially 360° first to shift said carriage from one extreme of movement to the other extreme of movement and secondly to shift said carriage back to the initial position, and switch means operable to connect the inductor of each pair having a tuning sleeve to the corresponding circuit when said means is rotated over one of said movements and the inductor of each pair having a tuning core to the corresponding circuit when said means is rotated over the other of said movements.

9. A tuning system to cover two frequency bands of frequency range too great for effective coverage by a single tuner, said system comprising a first tuner capable of effectively covering one of said bands and having a tuning member movable over a predetermined path to cover said band, a second tuner capable of effectively covering the other of said bands and having a tuning member movable over a predetermined path to cover said other band, means operable when moved continuously in one direction to move said members over their respective paths in a first movement from one extreme position to the other extreme position and in a second movement back to the original positions, and switch means operable to connect one of said tuners to said circuit during said first movement and the other of said tuners to said circuit during said second movement.

10. Tuning apparatus for a two-band radio receiver comprising a coil provided with and tunable by a slidable permeable core, a coil provided with and tunable by a slidable conducting sleeve, said core-tuned coil and said sleeve-tuned coil being mounted with their respective axes in parallel planes, an elongated track member mounted parallel to said coil axes, a support member oriented transversely to said track member and mounted thereon for movement therealong, means linking the core and the sleeve to the support member whereby movement of the support member along the track member will move the core and sleeve within their respective coils, a shaft adapted to receive a manually operable member for rotation thereof, and mechanical coupling means linking said shaft to said support member operative on rotation of said shaft through 360° to advance said support member along said track member and to retract the same to its original position.

11. Apparatus according to claim 10 wherein circuit means is provided for connecting said coils to an external circuit, said circuit means comprising a switch, and mechanical linkage connecting said switch to said shaft operative to actuate the same to switch the external circuit from one coil to the other when the shaft is rotated through the position of maximum excursion of the support member in one direction.

12. Apparatus according to claim 10 wherein mechanical detent means are provided to arrest movement of the shaft at a plurality of predetermined angular positions, and wherein the means connecting the core and sleeve to the support means are provided with fine mechanical adjustments adapted to permit trimming of the coil tuning for a given angular position of the shaft.

13. Apparatus according to claim 10 wherein the mechanical coupling means comprises a shaped cam keyed to the shaft and having its curved face mounted eccentrically with respect thereto, operative to press on the support member and move it through a reciprocating locus during a complete rotation of the shaft.

DONALD R. DE TAR.

REFERENCES CITED

The following references are of record in the file of this patent:

UNITED STATES PATENTS

| Number | Name | Date |
|---|---|---|
| 2,270,117 | Fill | Jan. 13, 1942 |
| 2,276,699 | Preisig | Mar. 17, 1942 |
| 2,320,483 | Stocker | June 1, 1943 |
| 2,503,579 | Fisher | Apr. 11, 1950 |
| 2,533,810 | Jacob et al. | Dec. 12, 1950 |
| 2,534,786 | E. L. Hall | Dec. 19 ,1950 |
| 2,538,717 | Weber | Jan. 16, 1951 |

FOREIGN PATENTS

| Number | Country | Date |
|---|---|---|
| 331,853 | Germany | Jan. 15, 1921 |